(12) United States Patent
Iwasaki

(10) Patent No.: US 7,349,592 B2
(45) Date of Patent: Mar. 25, 2008

(54) OPTOELECTRONIC CIRCUIT BOARD WITH OPTICAL WAVEGUIDE AND OPTICAL BACKPLANE

(75) Inventor: Tatsuya Iwasaki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 243 days.

(21) Appl. No.: 10/546,780

(22) PCT Filed: Apr. 20, 2004

(86) PCT No.: PCT/JP2004/005656

§ 371 (c)(1),
(2), (4) Date: Aug. 25, 2005

(87) PCT Pub. No.: WO2004/095105

PCT Pub. Date: Nov. 4, 2004

(65) Prior Publication Data

US 2006/0159386 A1    Jul. 20, 2006

(30) Foreign Application Priority Data

Apr. 21, 2003  (JP) .............................. 2003-115163

(51) Int. Cl.
  *G02B 6/12* (2006.01)
  *G02B 6/122* (2006.01)
(52) U.S. Cl. ..................... 385/14; 385/129; 385/130; 385/132
(58) Field of Classification Search .................. 385/14
See application file for complete search history.

(56) References Cited

U.S. PATENT DOCUMENTS

| 4,776,661 | A | * | 10/1988 | Handa ............................ 385/37 |
| 5,252,513 | A | * | 10/1993 | Paoli et al. ..................... 438/24 |
| 5,357,122 | A | | 10/1994 | Okubora et al. ............... 257/84 |
| 5,400,419 | A | | 3/1995 | Heinen ............................ 385/14 |
| 5,521,992 | A | | 5/1996 | Chun et al. ..................... 385/14 |
| 5,568,574 | A | * | 10/1996 | Tanguay et al. ............... 385/14 |
| 6,343,171 | B1 | | 1/2002 | Yoshimura et al. ............ 385/50 |
| 6,669,801 | B2 | * | 12/2003 | Yoshimura et al. .......... 156/230 |
| 6,928,205 | B2 | * | 8/2005 | Ouchi ............................. 385/14 |
| 7,050,675 | B2 | * | 5/2006 | Zhou .............................. 385/37 |
| 7,110,629 | B2 | * | 9/2006 | Bjorkman et al. ............. 385/14 |

FOREIGN PATENT DOCUMENTS

| EP | 0322218 A3 | 6/1989 |
| EP | 1 020 748 A1 | 7/2000 |
| JP | S61-121014 A | 6/1986 |
| JP | 62-123411 | 6/1987 |
| JP | 62-124510 | 6/1987 |
| JP | 08-293836 | 5/1996 |
| JP | 2002-124661 A | 4/2002 |
| JP | 2003-057468 A | 2/2004 |
| JP | 2004-177962 | 6/2004 |

* cited by examiner

*Primary Examiner*—Michelle Connelly-Cushwa
(74) *Attorney, Agent, or Firm*—Fitzpatrick, Cella, Harper & Scinto

(57) ABSTRACT

An optical transmission device comprises an optical transmission medium and a plurality of optical receivers, and the optical transmission medium has a linear line waveguide. At least one of the optical receivers is adapted to receive a first optical signal propagated through the line waveguide, while at least one of the optical receivers is adapted to receive a second optical signal propagated through the optical transmission medium.

5 Claims, 6 Drawing Sheets

OPTOELECTRONIC CIRCUIT BOARD WITH OPTICAL WAVEGUIDE AND OPTICAL BACKPLANE

TECHNICAL FIELD

The present invention relates to an optical transmission device including a two-dimensional (2D) or three-dimensional (3D) optical transmission medium and a line waveguide and also to an optoelectronic circuit including such an optical transmission device and thereby comprising a mixture of electronic circuits and optical circuits.

BACKGROUND ART

In recent years, information processing instruments such as personal computers, mobile phones and PDAs (personal digital assistants) have been required to show a high processing speed in addition to be compact and lightweight. However, as the processing speed rises, there arise various problems including wire-attributable delays and EMIs (electromagnetic interferences).

Proposed techniques for avoiding wire-attributable delays and EMIs include the use of an optical wire or a line waveguide (U.S. Pat. No. 5,357,122).

Optical wires provide advantages including high speed transmission capabilities and being intrinsically free from electromagnetic inductions. However, in the above-mentioned technique using a line waveguide, optical wires having a thickness between several microns and tens of several microns are used and the wiring pattern is fixed. Therefore, the use of such a line waveguide is accompanied by a number of problems including the need of using a large number of optical switches, the difficulty of aligning optical axes, the need of micro-processing the optical waveguide, the use of a large number of parts and the difficulty of preparation if an enhanced degree of freedom for wiring and alteration of an optical circuit is to be desired.

U.S. Pat. No. 5,191,219, on the other hand, discloses an information processing apparatus comprising means for forming a planar optical waveguide which extends in two dimensions and serves as a shared medium, a plurality of light-emitting means and a plurality of light-detecting means extending in a two-dimensional arrangement over the planar optical waveguide for broadcasting light signals and abstracting light signals, respectively, into and from the planar optical waveguide, and a plurality of subsystems including input and output ports for processing the light signals in the shared medium, the light-detecting means being coupled to input ports and the light-emitting means being coupled to output ports of the subsystems.

However, the information processing apparatus disclosed in the above U.S. patent document is not satisfactory in terms of the degree of freedom for optical wiring.

DISCLOSURE OF THE INVENTION

An optical transmission device according to the invention comprises an optical transmission medium and a plurality of optical receivers, and the optical transmission medium has a linear line waveguide. At least one of the optical receivers is adapted to receive a first optical signal propagated through the line waveguide, while at least one of the optical receivers is adapted to receive a second optical signal propagated through the optical transmission medium. The optical transmission medium is typically a sheet-shaped two-dimensional optical waveguide. However, it may alternatively be a three-dimensional optical transmission medium, which may be cubic or spherical. Since a two-dimensional or three-dimensional optical transmission medium and a linear line waveguide are arranged in a mixed state in the above arrangement, it is possible to realize an optical transmission device that is adapted for high speed/operation with flexibility and is structurally compact.

There can be a number of different modes of carrying out the invention that can be provided with the above-described basic arrangement.

Part of the second optical signal may be so arranged as to pass at least part of the line waveguide. It may also be so arranged that an optical transmission device according to the invention comprises a plurality of optical transmitters and the first optical signal transmitted from at least one of the optical transmitters is propagated through the line waveguide while the second optical signal transmitted from at least one of the optical transmitters is coupled to a non-line section of the optical transmission medium, which is the part thereof other than the line waveguide, and propagated through the optical transmission medium. Additionally, it may be so arranged that the transmission route of the first optical signal and that of the second optical signal intersect each other as viewed from the top surface of the optical transmission medium.

It may be so arranged that the line waveguide is made to show a complex refractive index greater than that of the non-line section of the optical transmission medium, which is the part thereof other than the line waveguide, so that light being propagated in parallel with the part is guided and propagated with priority. The difference of the complex refractive indexes is preferably not greater than 1%, more preferably not greater than 0.5%, when light being propagated through the entire optical transmission medium passes through the line waveguide, so as to reduce the influence thereof (in other words, so as to reduce the loss and the refraction when light being propagated through the non-line section strikes the line waveguide and is transmitted through it).

The ½-th power of the cross sectional area of the line waveguide is preferably not greater than ¼, more preferably not greater than ⅛, of the thickness of the sheet-shaped optical transmission medium so as to be able to prevent light being propagated through the optical transmission medium from being coupled to the line waveguide.

It may be so arranged that an optical signal in a single mode is propagated through the line waveguide while an optical signal in a multi-mode is propagated through the optical transmission medium. It may be so arranged that the optical signal being propagated through the optical transmission medium in a multi-mode has a beam-shaped profile or it is propagated only through a particular region or it is propagated through the entire optical transmission medium.

The optical transmitters may be embedded in the optical transmission medium. The optical transmitters may have a plurality of light emitting elements and light from at least one of the light emitting elements is coupled to the line waveguide and light from at least one of the light emitting elements is coupled to the non-line section.

An optoelectronic circuit according to the invention comprises an optical transmission device as defined above and an electric wiring layer including electric wires and electronic devices, the optical transmission device and the electric wiring layer being laid one on the other, and the electric devices are connected to the optical transmitters or the optical receivers by way of the electric wires.

Such an optoelectronic circuit according to the invention may comprise an optical transmission device according to the invention and an electric wiring layer that are laid one on the other so that it is free from problems including signal delays of electric wiring and EMIs and adapted to raise the degree of design freedom as circuit board.

BEST MODE FOR CARRYING OUT THE INVENTION

Now, an embodiment of optical transmission device according to the invention will be described by referring to FIGS. 1A through 1C.

Figure 1A:
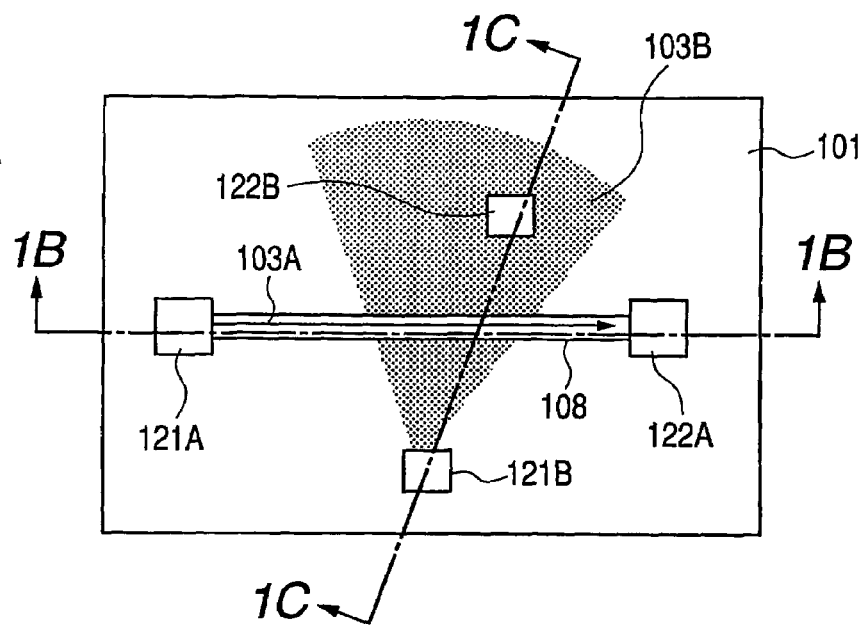
FIGS. 1A, 1B and 1C are schematic illustrations of an embodiment of optical transmission device according to the invention.
Figure 1B:
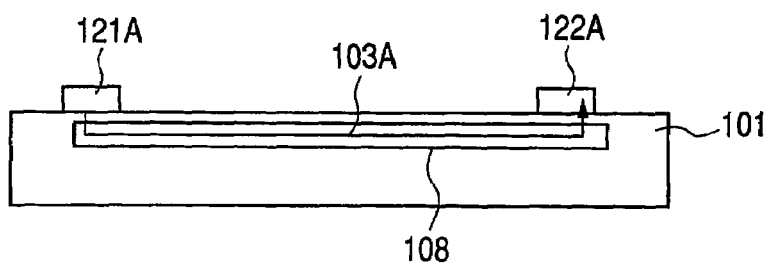
Figure 1C:
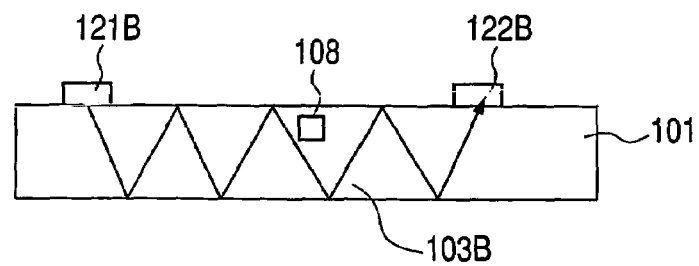

In FIGS. 1A through 1C, there are shown a film-shaped two-dimensional optical transmission medium 101, optical signals 103A and 103B, a line waveguide 108, optical transmitters (optical transmitter sections) 121A and 121B and optical receivers (optical receiver sections) 122A and 122B. The optical receivers 122A and 122B receive an optical signal propagated through the optical transmission medium 101 or the line waveguide 108 and convert the received optical signal into an electric signal.

The film-shaped optical transmission medium 101 has the line waveguide 108 in the inside thereof. When, for example, a linear part showing a refractive index of n2 is arranged in the inside of an optical transmission medium showing a refractive index of n1 (n2>n1), it is possible to propagate light with priority as the light is guided by that part. Such a linear structure is referred to as a line waveguide in this letter of specification regardless of its structure so long as it provides an optical path that guides light and propagates it with priority. All the part of the optical transmission medium other than the line waveguide is referred to as non-line section. Thus, for the purpose of the present invention, a two-dimensional or three-dimensional optical transmission medium is an aggregate of a line waveguide and a non-line section.

For the purpose of the-present invention, at least one of the optical receivers is adapted to selectively receive a first optical signal propagated through the line waveguide. Additionally, at least one of the optical receivers is adapted to receive a second optical signal freely propagated through the optical transmission medium (the line waveguide and the non-line section). In the case of the embodiment of FIGS. 1A through 1C, the optical receiver 122A is adapted to selectively receive a first optical signal 103A propagated through the line waveguide 108 and the optical receiver 122B is adapted to receive a second optical signal 103B freely propagated through the optical transmission medium 101. However, the present invention is by no means limited thereto and alternatively each of the optical receivers may be adapted to selectively receive an optical signal from the line waveguide or an optical signal from the non-line section. Still alternatively, each of the optical receivers may be so adapted as to receive both an optical signal from the line waveguide and an optical signal from the non-line section.

Figure 7A:
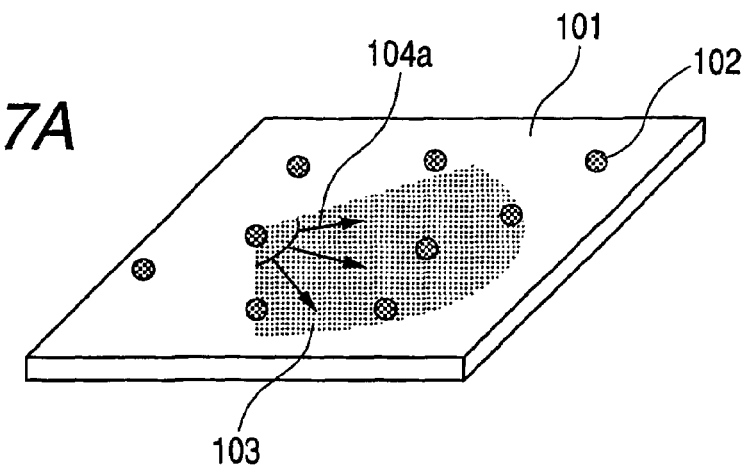
FIGS. 7A and 7B are schematic exemplar illustrations of propagation of optical signal in an optical transmission medium.
Figure 7B:
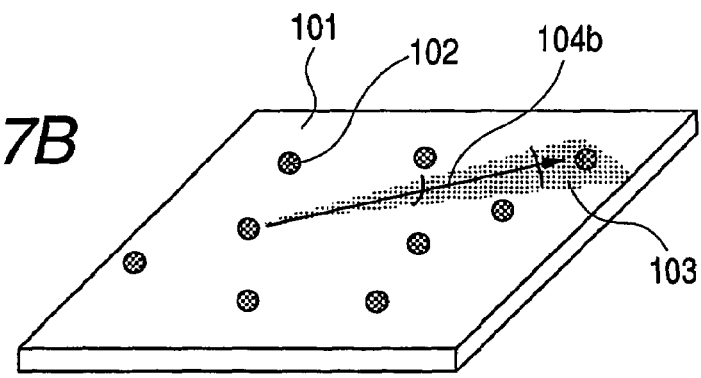

While signal transmission using the line waveguide 108 takes place only on a fixed wiring basis, free signal propagation can occur when the optical transmission medium 101 is regarded as two-dimensional optical waveguide (free two-dimensional space). More specifically, as shown in FIGS. 7A and 7B, the optical signal 103B is beamed to be propagated in a particular region or broadcasted for the entire two-dimensional optical waveguide in a diffused manner. Still additionally, a particular routing can be arbitrarily defined for the purpose of propagating it. Due to the use of a two-dimensional optical waveguide, it is possible to arrange optical devices at desired positions and optical data can be two-dimensionally transmitted from a port arranged at a desired position to another port also arranged at another desired position.

Thus, according to the invention, information can be freely transmitted in any desired direction by using an optical transmission medium as two-dimensional or three-dimensional optical waveguide while a line waveguide is used for fixed optical wiring. Differently stated, a linear optical waveguide and a two-dimensional or three-dimensional optical waveguide (optical transmission medium) that can two-dimensionally or three-dimensionally freely propagate light can be made to share the same space and can be selectively used.

An optical transmission device according to the invention may comprise a plurality of optical transmitters. At least one of the optical transmitters may be adapted to propagate an optical signal through the line waveguide, while at least one of the remaining optical transmitters may be adapted to couple an optical signal to the non-line section and freely propagate it through the optical transmission medium. In the case of the embodiment of FIGS. 1A through 1C, the optical transmitter 121A transmits a first optical signal 103A that propagates through the line waveguide 108, whereas the optical transmitter 121B transmits a second optical signal 103B that freely propagates through the optical transmission medium 101.

Furthermore, a plurality of optical ports that operate both as optical transmitters and as optical receivers may be connected to the optical transmission medium. With this arrangement, the plurality of optical ports can share the optical transmission medium for optical communications. Additionally, the degree of freedom of connecting optical circuits is improved when the line waveguide and the two-dimensional or three-dimensional waveguide are freely used. Both of them can be used simultaneously or selectively by switching the mode of propagation.

It may be so arranged that light that propagates freely, using the optical transmission medium as two-dimensional or three-dimensional optical waveguide, partly passes through the line waveguide. Then, the line waveguide and the two-dimensional or three-dimensional optical waveguide literally share the same space. Particularly, the difference between the refractive index of the optical transmission medium and that of the line waveguide is made small so that light can pass through the line waveguide (and light may not be lost or scattered to a large extent when passing through the line waveguide). The difference is preferably not more than 1%, more preferably not more than 0.5%, although it may vary depending on the system comprising the optical transmission medium and the line waveguide. A distribution refractive index type line waveguide may be used.

While the above-described arrangement is advantageous from the viewpoint of easiness of preparation, signal interferences may be apprehended. However, signal interferences that can occur when light that is freely propagating the optical transmission medium is coupled to the line waveguide can be practically eliminated in a manner as described below. For example, the problem can be eliminated when the diameter of the line waveguide is made sufficiently smaller than the thickness of the sheet-shaped optical transmission medium. Preferably, the ½-th power of the cross sectional area of the line waveguide (core section) is not greater than ¼, more preferably not greater than ⅛, of the thickness of the sheet-shaped optical transmission medium, although the value may vary depending on the selected threshold for signal error rate. For example, the use of a line waveguide having a diameter of 10 microns may be satisfactory when the optical transmission medium has a thickness of 100 microns. Additionally, the above cited problems can be further reduced when the route of propagation of light is (the positions of the transmitters and the receivers are) so designed in advance that passing light strikes the line waveguide with a sufficient angle, for instance an angle close to right angles, relative to the latter.

On the other hand, it is preferable that the line waveguide shows a refractive index that is greater than those of the components surrounding it for the purpose of preventing light that is propagating through the line waveguide from leaking into the two-dimensional or three-dimensional optical waveguide. In other words, the line waveguide is preferably provided with a core-clad arrangement commonly used.

The line waveguide and the two-dimensional or three-dimensional waveguide can be used simultaneously when the problem of interferences does not arise between them. Additionally, it is possible to make the route of propagation of light in the line waveguide and the one in the two-dimensional or three-dimensional waveguide intersect each other to remarkably raise the degree of freedom of optical connections.

Signal interferences can be avoided almost completely when an optical transmission device according to the invention is designed in a manner as described above. However, if interferences occur inevitably due to the design of the device, they can be avoided by means of time division multiplexing or wavelength division multiplexing. Such an arrangement still provides the advantage of sharing the same space and that of selecting free propagation or fixed propagation.

Figure 2:
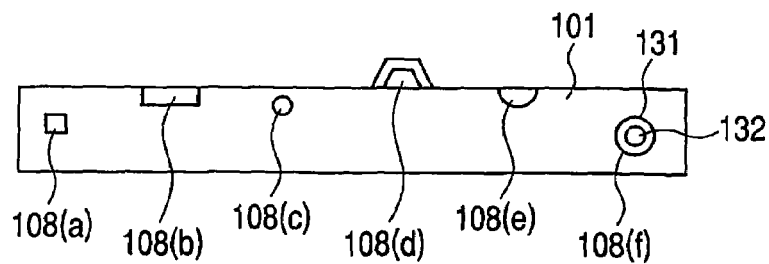
FIG. 2 is a schematic cross sectional view of an exemplar line waveguide that can be used in the optical transmission medium.

Now, the structural relationship between the line waveguide and the two-dimensional or three-dimensional waveguide will be described by referring to FIG. 2. FIG. 2 is a schematic cross sectional view of exemplar line waveguides 108 that can be used in the optical transmission medium 101 of an optical transmission device according to the invention. The cross sectional views of the line waveguides 108 in FIG. 2 include rectangular, circular and elliptic.

All the line waveguides may be buried in the optical transmission medium or only part of them may be buried. In the case of a line waveguide having a rectangular cross section, one of the sides thereof may be made to be flush with the surface of the optical transmission medium. In FIG. 2, 108(a) is a line waveguide 108 having a square cross section and buried in the middle of the optical transmission medium 101 and 108(b) is a line waveguide having a rectangular cross section and buried in the optical transmission medium 101 in such a way that one of its side is made to be flush with the top surface of the optical transmission medium 101, whereas 108(c) is a line waveguide having a circular cross section and buried in an upper position of the optical transmission medium 101 and 108(d) is a line waveguide having a trapezoidal cross section and arranged on the optical transmission medium 101. In FIG. 2, 108(e) is a line waveguide having a semicircular cross section and arranged at the top surface of the optical transmission medium 101 and 108(f) is a line waveguide having a circular cross section (which may be an optical fiber) and provided with a core 132 and a clad 131, the line waveguide 108(f) being buried in the optical transmission medium 101.

As described above, the complex refractive index of the line waveguide preferably shows a value close to that of the complex refractive index of the non-line section. For example, the difference is to be made smaller than several percents. This arrangement can significantly reduce the loss of light when light being propagated through the two-dimensional or three-dimensional optical waveguide is made to pass through the line waveguide. A small difference of the complex refractive indexes is preferable additionally because it can reduce the number of propagation modes to realize a high speed transmission in the line waveguide when the non-line section operates as clad for the line waveguide.

As pointed out above, it is possible to provide a wide margin for interferences by reducing the diameter of the line waveguide relative to the thickness of the two-dimensional or three-dimensional waveguide. Additionally, it is possible to allow only an optical signal in a single mode to be propagated through the line waveguide when its diameter is made sufficiently small. More specifically, in a preferable embodiment as shown in FIG. 2, the non-line section is used as clad for the line waveguide 108 and the difference between the refractive index of the line waveguide and that of the non-line section is made small while the diameter of the line waveguide 108 is reduced. A typical example of this technique may be to allow only an optical signal in a single mode to be propagated through the line waveguide. On the other hand, a multi-mode propagation takes place in the two-dimensional or three-dimensional optical waveguide because of the large thickness thereof. This is preferable from the viewpoint of easiness of designing it and optically aligning it with optical devices.

Meanwhile, in the case of transmission of information using a two-dimensional or three-dimensional optical waveguide, where light is propagated with a radiation angle Øa, the intensity of light at the signal receiving site is reduced proportionally relative to L/(RØa) (L: size of optical receiver, R: distance). Additionally, propagation of light with a large radiation angle entails waste of light except in the direction in which light is received. Since an optical circuit provided with the advantages of a line waveguide and those of a two-dimensional or three-dimensional waveguide is realized in a single optical transmission device (optical transmission layer) according to the invention, the above problem can be reduced by selectively using the waveguides depending on the situation of the device. Typically, in a preferred mode of carrying out the invention, the line waveguide will be used for high speed signal transmissions whereas the optical transmission medium, or the two-dimensional or three-dimensional waveguide, will be used for free but relatively low speed transmissions. Since a line waveguide allows communications with a sufficiently high intensity of light, it can transmit data reliably at high speed.

The reliability of high-speed data transmission will be improved further if the line waveguide is designed so as to allow only one or more than one propagation modes (e.g., a single mode waveguide that allows transmission of light only in a fundamental mode).

The line waveguide may be used exclusively for 1:1 fixed wiring, whereas the two-dimensional or three-dimensional optical waveguide may be used for free connections that may include 1:n broadcast communications and m:n communications. In other words, while a large number of optical switches are required for free connections using a conventional line waveguide, according to the invention, free connections can be realized with ease by using a two-dimensional or three-dimensional optical waveguide, while high speed communications will be allowed to take place by arranging a line waveguide in advance on a critical paths that may be required for high speed communications. Thus, 1:1 high speed communications and low speed communications such as 1:n communications and m:n communications can take place in a single layer simultaneously.

Furthermore, since a line waveguide is buried in a two-dimensional or three-dimensional waveguide, it is possible to realize a compact communications system that does not have a large number of layers at low cost. Additionally, since a line waveguide is arranged on a critical line according to the invention, the labor for aligning the waveguide and optical device is lightened because it is no longer necessary to rigorously align all the related elements. Still additionally, since both the two-dimensional or three-dimensional waveguide and the line waveguide are arranged in a single layer to reduce the total number of layers, it is possible to produce a low profile and high density circuit board at low cost.

Now, the components of an embodiment of optical transmission device will be described below.

An appropriate material selected from glass, a semiconductor, an organic material or the like can be used for the optical transmission medium 101 so long as the selected material shows a transmittance that is sufficiently high relative to light to be propagated. For example, a glass substrate, a single crystal substrate of lithium niobate or the like, a semiconductor substrate of Si, GaAs or the like or an organic sheet of polycarbonate, acryl, polyimide, polyethylene terephthalate or the like that is commercially available may be used without processing it specially. Additionally, vacuum evaporation, dipping, application or some other film forming technique may be used for preparing the optical transmission medium 101. Similarly, the optical transmission medium 101 may be prepared by injection molding, extrusion molding or some other molding technique. A clad layer may be formed by using a coating process of forming a layer having a different refractive index. As for the size of the optical transmission medium 101, it may be typically between 100 microns and tens of several centimeters in view of the fact that information is transmitted between two-dimensionally or three-dimensionally arranged positions, although the information transmission speed may have to be taken into consideration. The optical transmission medium 101 can have a thickness between 10 microns and several centimeters, although the thickness is preferably between 50 microns and several millimeters from the viewpoint of ease of optical alignment.

Materials listed above for the optical transmission medium 101 can also be used for the line waveguide 108 that is part of the optical transmission medium 101. As pointed out above, the line waveguide has a cross sectional area that is sufficiently smaller than the thickness of the optical transmission medium and may be within a range between a micron and hundreds of several microns. While the line waveguide is normally linear, it may alternatively be curved and/or branched.

Light emitting elements that can be used for the optical transmitters include laser diodes and LEDs. A plurality of light emitting elements may be arranged for a single optical transmitter. For example, a light emitting element that is coupled to the line waveguide and a light emitting element that is coupled to the non-line section may be provided. Alternatively, a plurality of light emitting elements may be coupled to the non-line section and so arranged as to show different directions of propagation of light.

An optical coupler to be used for an optical transmitter is preferably adapted to radiate light from a light emitting element toward the two-dimensional or three-dimensional waveguide with a predetermined radiation angle. From this viewpoint, a lens, a prism, a mirror or a grating may be used for it. Particularly, the use of a conical, pyramidal or spherical mirror is preferable because it can radiate light toward the two-dimensional or three-dimensional waveguide with a predetermined radiation angle.

Figure 3A:
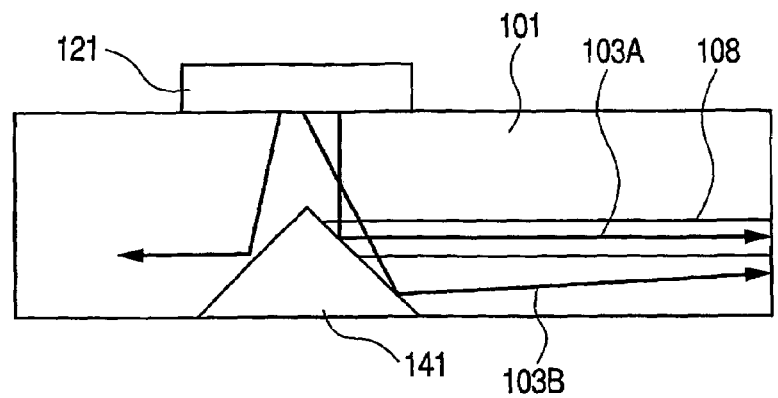
FIGS. 3A, 3B and 3C are schematic cross sectional views of an optical transmitter and its vicinity of an embodiment of optical transmission device according to the invention.
Figure 3B:
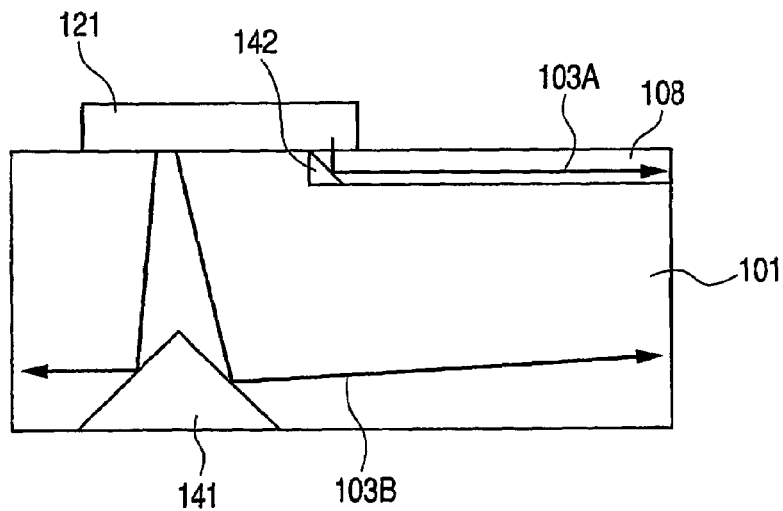
Figure 3C:
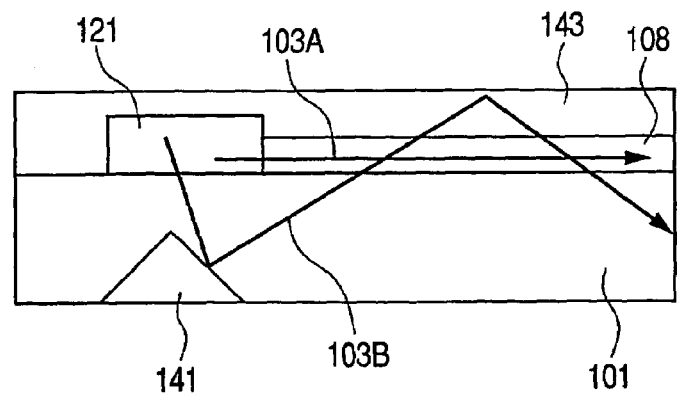

FIGS. 3A, 3B and 3C are schematic cross sectional views of an optical transmitter 121 and its vicinity of an embodiment of optical transmission device according to the invention. FIG. 3A shows a light scattering body 141 adapted to operate both for optical coupling to the line waveguide 108 and optical coupling to the two-dimensional or three-dimensional waveguide 101. More specifically, light emitted from the optical transmitter 121 may be irradiated onto part of the light scattering body 141 locally so as to be coupled to the line waveguide 108. Alternatively, it may be irradiated onto the entire light scattering body 141 so as to be diffused and propagated broadly in all directions. Switching from local irradiation to overall irradiation and vice versa can be controlled by means of a mirror (not shown) or providing in advance a light emitting element for local irradiation and a light emitting element for overall irradiation and selectively driving either one of them. The use of two light emitting elements may be preferable because it is possible to independently and simultaneously output an optical signal 103A to the line waveguide 108 and another optical signal 103B to the two-dimensional or three-dimensional waveguide 101.

FIG. 3B shows a mirror 142 and a light scattering body 141 adapted to operate respectively for optical coupling to the line waveguide 108 and for optical coupling to the two-dimensional or three-dimensional waveguide 101. In this instance again, two light emitting elements may be provided and selectively used. Optical coupling to the line waveguide 108 can be made more reliably when the line waveguide 108 is arranged at a position close to the optical transmitter 121 (on the light transmission medium 101 in FIG. 3B).

In FIG. 3C, the optical transmitter 121 is buried in the light transmission medium (coat layer) 143. Light emitted from the optical transmitter 121 vertically downward (downward in FIG. 3C) is scattered by the light scattering body 141 and coupled to the two-dimensional or three-dimensional waveguide 101. On the other hand, light emitted from the optical transmitter 121 horizontally (transversally in the figure) is directly coupled to the line waveguide 108. This arrangement is preferable for realizing a compact device.

Meanwhile, optical receivers may be arranged to correspond to the optical transmitters 121 of FIGS. 3A through 3C (to invert the arrows representing optical signals). Preferably, they are arranged so as to receive light from all directions of the two-dimensional or three-dimensional waveguide 101. With such an arrangement, all the optical receivers may be made to have the same and simple configuration. Of course, optical receivers may be so arranged as to receive light from predetermined directions of the two-dimensional or three-dimensional waveguide 101.

Light receiving elements that can be used for the light receivers include PIN photodiodes and MSM photodiodes. Optical couplers can also be used for optical receiver. From the above-described viewpoint, optical couplers to be applied to the optical receivers preferably receive light from all directions, or intra-planar 360°, and the use of a conical or spherical mirror is therefore preferable.

A plurality of light receiving sections arranged in array may be used for a port. Particularly, the light receiving sections of the array may be so arranged that light strikes the light receiving sections of the array in different respective directions. Then, the direction from which light arrives can be discerned by selectively using the light receiving sections of the array. Alternatively, a light receiving section may be so arranged that it can selectively receive light being propagated through the line waveguide.

Figure 6:
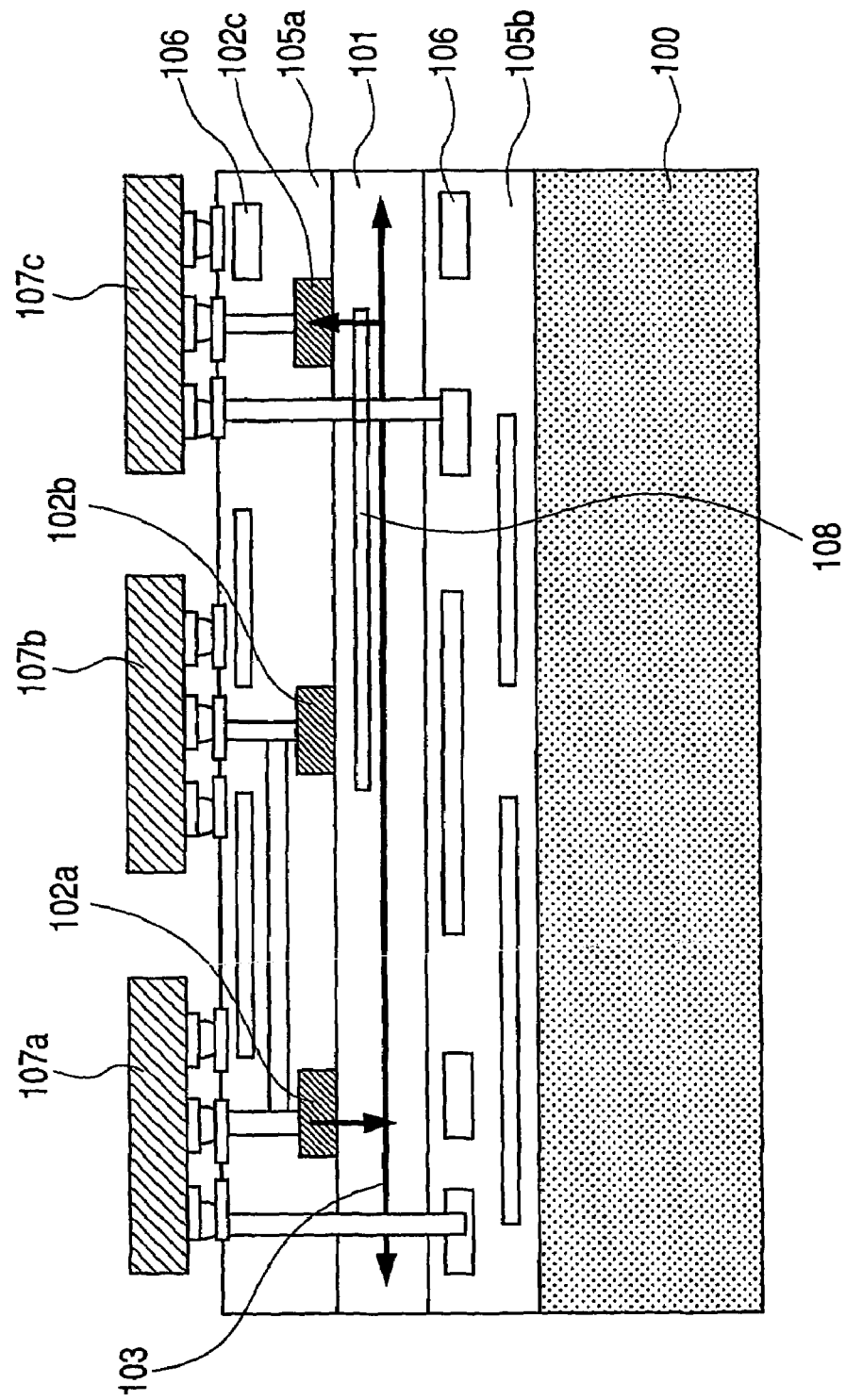
FIG. 6 is a schematic cross sectional view of the optoelectronic circuit formed by laying an electronic circuit and an optical circuit and used in Example 4.

The light transmission medium 101 may be arranged on an appropriate substrate. Substrates that can be used for arranging the light transmission medium 101 thereon include printed substrates, metal substrates such as aluminum substrates and SUS substrates, semiconductor substrates of Si substrates and GaAs substrates, insulating substrates such as glass substrates and resin substrates or sheets of PMMA, polyimides and polycarbonates. FIG. 6 shows an embodiment of optoelectronic circuit according to the invention. In the optoelectronic wired substrate of FIG. 6, an electric wiring layer 106 carrying electric wires 106 and electronic devices (LSI) 107 (107a through 107c) is laid on a film-like optical transmission medium 101 and electric signals from the. electronic devices 107 are sent to any of the optical transmitters or optical receivers (ports 102). With this arrangement, a signal from an electronic device 107 is converted into an optical signal by an optical transmitter and then transmitted to an optical receiver by way of the line waveguide 108 or the two-dimensional or three-dimensional waveguide 101 and then further to another electronic device 107.

As shown in FIG. 6, an electronic circuit comprising electronic devices 107 and electric wires 106 connecting them and an optical circuit using an optical transmission medium 101 coexist in an optoelectronic circuit according to the invention. A signal from an electronic device 107 is converted into an optical signal in one of the ports 102 (102a through 102c) and the produced optical signal 103 is propagated through the optical transmission medium 101 or the line waveguide 108 before it is converted back into an electric signal by another one of the ports 102 to establish an optical circuit.

The ports 102 have a function of transmitting or receiving an optical signal. More specifically, the ports comprise one or more than one optical transmitters adapted to convert an electric signal into an optical signal or one or more than one optical receivers adapted to convert an optical signal into an electric signal. However, from a functional point of view, they preferably comprise both optical transmitters and optical receivers.

Figure 8:
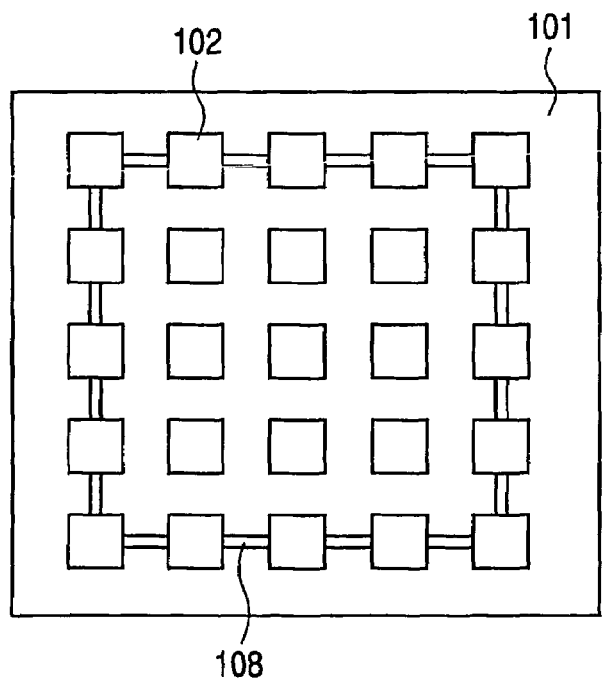
FIG. 8 is a schematic plan view of the ports of an optical transmission device according to the invention, showing an exemplar arrangement thereof.

While FIG. 6 shows a cross sectional view of a relatively simple circuit that comprises three ports 102, of which one is used for signal transmission and another one is used for signal reception, it is possible to arrange any given number of ports 102 at any desired positions on a plane as shown in a plan view of FIG. 8.

While the ports 102 are arranged on and held in contact with the optical transmission medium 101 in FIG. 6, they may alternatively be buried in the optical transmission medium 101 so as to directly couple light to the waveguide or arranged on any of the end facts of the optical transmission medium 101.

The electric wires 106 are metal wires made of aluminum, copper or the like. They may be formed by vacuum evaporation or by using electrically conductive paste and a screen printing technique. Alternatively, they may be realized in the form of a circuit conductor pattern that is produced by laying a metal foil such as an electrolytic copper foil and chemically etching the metal foil layer, using a piece of etching resist that shows a desired pattern. Devices that can be used for the electronic devices 107 may include electric parts such as resistors and capacitors as well as ICs and LSI chips such as CPUs, RAMs and RF oscillators.

A circuit board according to the invention and having the above described configuration has characteristic features of an optical circuit such as high speed operation and immunity of EMIs and provides an enhanced degree of freedom in terms of designing it. Additionally, the connections of the optical circuit can be altered freely and appropriately because of the use of a two-dimensional or three-dimensional optical waveguide.

Now, the present invention will be described further by way of examples. However, the present invention is by no means limited by the examples below in terms of configuration and preparing process.

EXAMPLE 1

In Example 1, an optical transmission device having a configuration similar to that of FIGS. 1A through 1C is prepared. In this example, the optical transmission medium 101 is made of fluorinated polyimide (refractive index: about 1.55) and has dimensions of 3 cm×5 cm. A single linear line waveguide 108 is buried so as to run horizontally in the optical transmission medium 101 as shown in FIGS. 1A through 1C. The line waveguide 108 shows a square cross section like that of 108(a) in FIG. 2 and each of the sides is about 25 microns long.

The refractive index of the line waveguide 108 is greater than that of the surrounding non-line section by about 1%. While both the line waveguide and the non-line section are made of fluorinated polyimide, their refractive indexes can be differentiated by differentiating the respective fluorine contents. The illustrated structure is formed by forming a film layer of fluorinated polyimide that makes the non-line section on a substrate, subsequently forming a line waveguide 108 and laying a coating film that makes the non-line section. The line waveguide 108 is formed by forming a film layer of fluorinated polyimide that makes the line waveguide, subsequently forming a resist film, patterning the resist film by photolithography and dry-etching the film layer of fluorinated polyimide, using oxygen plasma.

The line waveguide 108 shows a cross section of about 25 microns and hence it is a line waveguide that propagates light in a relatively small number of modes but not in a single mode. On the other hand, when light is propagated through the optical transmission medium 101 that operates as two-dimensional optical waveguide, the latter can propagate light in a large number of modes because it has a large thickness. FIG. 1C, which is a cross sectional view taken along line 1C-1C in FIG. 1A illustrates how a light beam 103B proceeds. It will be appreciated that a large number of beams of light can exist therein so as to be repeatedly reflected by the top and bottom surfaces.

In this example, optical transmitters 121 (121A and 121B) and optical receivers 122 (122A and 122B) are mounted in the optical transmission medium 101 as shown in FIGS. 1A through 1C. The optical transmitter 121A and the optical receiver 122A are separated from each other by a distance of about 4 cm, while the optical transmitter 121B and the optical receiver 122B are separated from each other by a distance of about 1.5 cm. A surface emission type laser (wavelength of emitted laser beam: 850 nm, output power; 3 mW) is used for each of the optical transmitters 121 and a PIN type photodiode of Si is used for each of the optical receivers 122. 45° mirrors (not shown) are arranged as light scattering bodies for the purpose of optically coupling the optical transmitters 121, the optical receivers 122, the line waveguide 108 and the non-line section. A technique of forming a desired pattern on the rear surface of the optical transmission medium 101 mechanically or by means of laser processing or etching and subsequently forming a metal film as mirror may be used to prepare the light scattering bodies.

The optical signal 103A output from the optical transmitter 121A and modulated by 700 MHz is propagated through the line waveguide 108 and received by the optical receiver 122A. The optical signal 103B output from the optical transmitter 121B and modulated by 400 MHz is coupled to the non-line section. Since the reflection surface of the 45° mirror that corresponds to the optical transmitter 121B is made coarse, the optical signal 103B is radiated with a radiation angle of about 60° and transmitted through the optical transmission medium 101 before it is received by the optical receiver 122B. At this time, the optical signal 103B partly passes through the line waveguide 108. In other words, the optical transmission path of the line waveguide 108 and the optical transmission path that involves the use of the two-dimensional waveguide intersect each other. However, since the difference between the refractive index of the line waveguide 108 and that of the non-line section is small and the dimensions of the cross section of the line waveguide 108 is sufficiently small relative to the thickness of the optical transmission medium 101, no problem of signal interference and optical loss arises. Thus, both the optical signal 103A and the optical signal 103B can be transmitted simultaneously.

Referring to FIGS. 1A through 1C, while the optical signal 103B is received only by the optical receiver 122B, the optical signal 103B can also be received at some other position if the optical signal 103B is propagated to that position and another optical receiver is arranged there.

From the above description of the example, it will be appreciated that the line waveguide 108 and the two-dimensional waveguide are arranged so as to share the same space and used simultaneously to take different roles. Thus, a compact optical transmission device that can be operated with an enhanced degree of inter-connect freedom is realized because the line waveguide and the two-dimensional waveguide operate in a single and same layer with the above described arrangement.

EXAMPLE 2

Figure 4A:
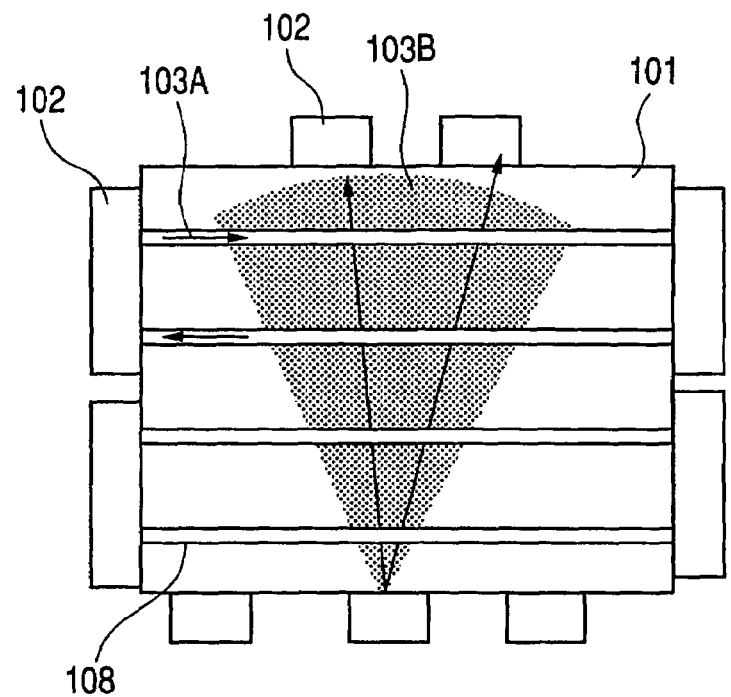
FIGS. 4A and 4B are schematic plan views of the optical transmission device used in Example 2.
Figure 4B:
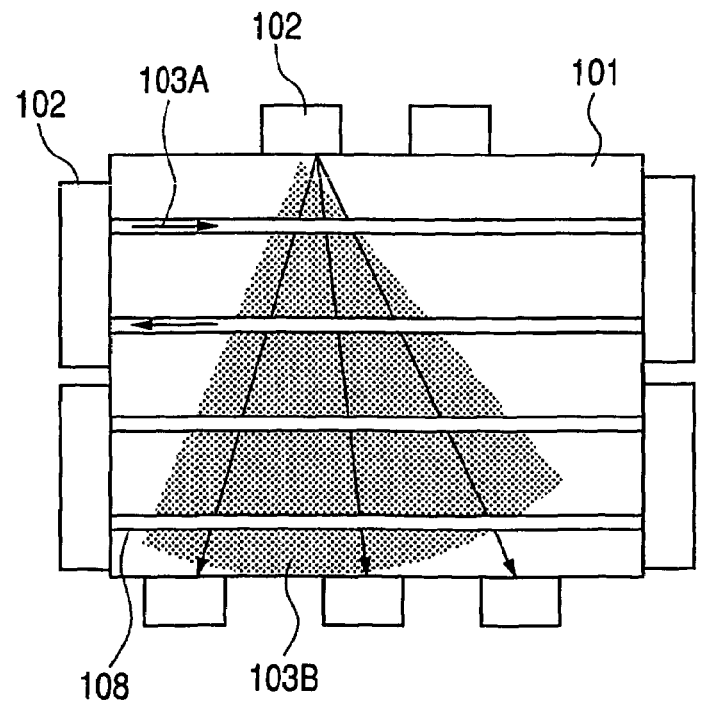

In Example 2, an optical transmission device having a configuration similar to that of FIGS. 4A and 4B is prepared. FIGS. 4A and 4B show plan views of the same arrangement. In this example, the optical transmission medium 101 is made of PMMA (refractive index: about 1.49) and optical fibers of quartz of a single mode are buried in the optical transmission medium 101 for line waveguides 108. The optical fibers show a cross section similar to that of 108(f) in FIG. 2. Thus, the cores 132 of the optical fibers operate as line waveguides 108 and the clad sections 131 of the optical fibers and the surrounding PMMA operate as non-line section.

The cores and the clad sections of the optical fibers show respective diameters of about 10 µm and about 125 µm and a relative refractive index of 0.2%. Since the optical transmission medium 101, or the PMMA layer, has a thickness of 200 µm, it can be used as a multi-mode two-dimensional optical waveguide, whereas the line waveguides 108 are single mode waveguides.

As shown in FIGS. 4A and 4B, the optical transmission medium 101 has a size of 3 cm square and is provided with optical ports 102 arranged on the facets thereof, each of the optical ports 102 having an optical transmitter and an optical receiver. A total of four line waveguides 108 are arranged horizontally in parallel with each other. Referring to FIGS. 4A and 4B, each of the optical ports 102 arranged at the lateral sides of the optical transmission medium 101 comprises an edge emission type laser (wavelength of emitted laser beam: 1,300 nm, output power; 5 mW) as optical transmitter and its output is coupled to the related line waveguide 108 by way of a lens and the corresponding facet of the optical transmission medium 101.

Referring to FIGS. 4A and 4B, each of the optical ports 102 arranged at the upper and lower sides of the optical transmission medium 101 also comprises an edge emission type laser (wavelength of emitted laser beam: 1,300 nm, output power; 5 mW) as optical transmitter and its output is directly coupled to the optical transmission medium (non-line section) by way of the corresponding facet. Since the end facet of the optical transmission medium of the coupling section is made coarse, the output optical signal is diffused and propagated toward all the oppositely disposed optical ports 102. The radiation angle is about 45°.

A PIN type photodiode of InGaAs is used for the optical receiver of each of the ports 102. Referring to FIGS. 4A and 4B, the optical receivers of the optical ports 102 arranged at the lateral sides of the optical transmission medium 101 are mounted in such a way that they can selectively receive the optical signals from the line waveguides 108 by way of a lens. On the other hand, the optical receivers of the optical ports 102 arranged on the upper and lower sides of the optical transmission medium 101 are adapted to directly receive the optical signal from the optical transmission medium (non-line section).

In this example, the optical signal 103A is modulated by 800 MHz, whereas the optical signal 103B is modulated by 100 MHz. Referring to FIGS. 4A and 4B, part of the optical signal emitted from any of the ports 102 arranged on the upper and lower sides of the optical transmission medium 101 crosses the line waveguides 108 but no problem of interferences occurs. This is because the line waveguides 108 have a diameter sufficiently smaller than the thickness of the optical transmission medium 101. Additionally, a wide margin is provided relative to interferences because the optical device is so designed that the angle by which the optical signal 103B intersects the line waveguides 108 is confined to a predetermined range (e.g., within a range between 45° and 90°).

Transversal communications from left to right and vice versa in FIGS. 4A and 4B are based on fixed wiring using the line waveguides 108. Vertical communications from top to bottom and vice versa in FIGS. 4A and 4B can be 1:N multicast communications. The current optical circuit can be altered (reconfigured) by switching the signal transmitting port 102 as shown in FIGS. 4A and 4B.

As described above, the optical transmission device of this example can handle high speed signals for optical transmissions between the ports arranged at the lateral sides of the device in FIGS. 4A and 4B by using the line waveguides. On the other hand, optical transmissions between the ports arranged at the upper and lower sides of the device in FIGS. 4A and 4B can be handled with an enhanced degree of inter-connect freedom because the two-dimensional optical waveguide is used for them. In other words, the line waveguides and the two-dimensional waveguide in this example are arranged and can be simultaneously used so as to share a space and hence the circuit is provided both with flexibility and with a functional feature of high speed transmission. Particularly, a circuit board where an electric circuit and an optical transmission device according to the invention and having a configuration as described above coexist will be adapted to freely alter the optical circuit.

EXAMPLE 3

Figure 5:
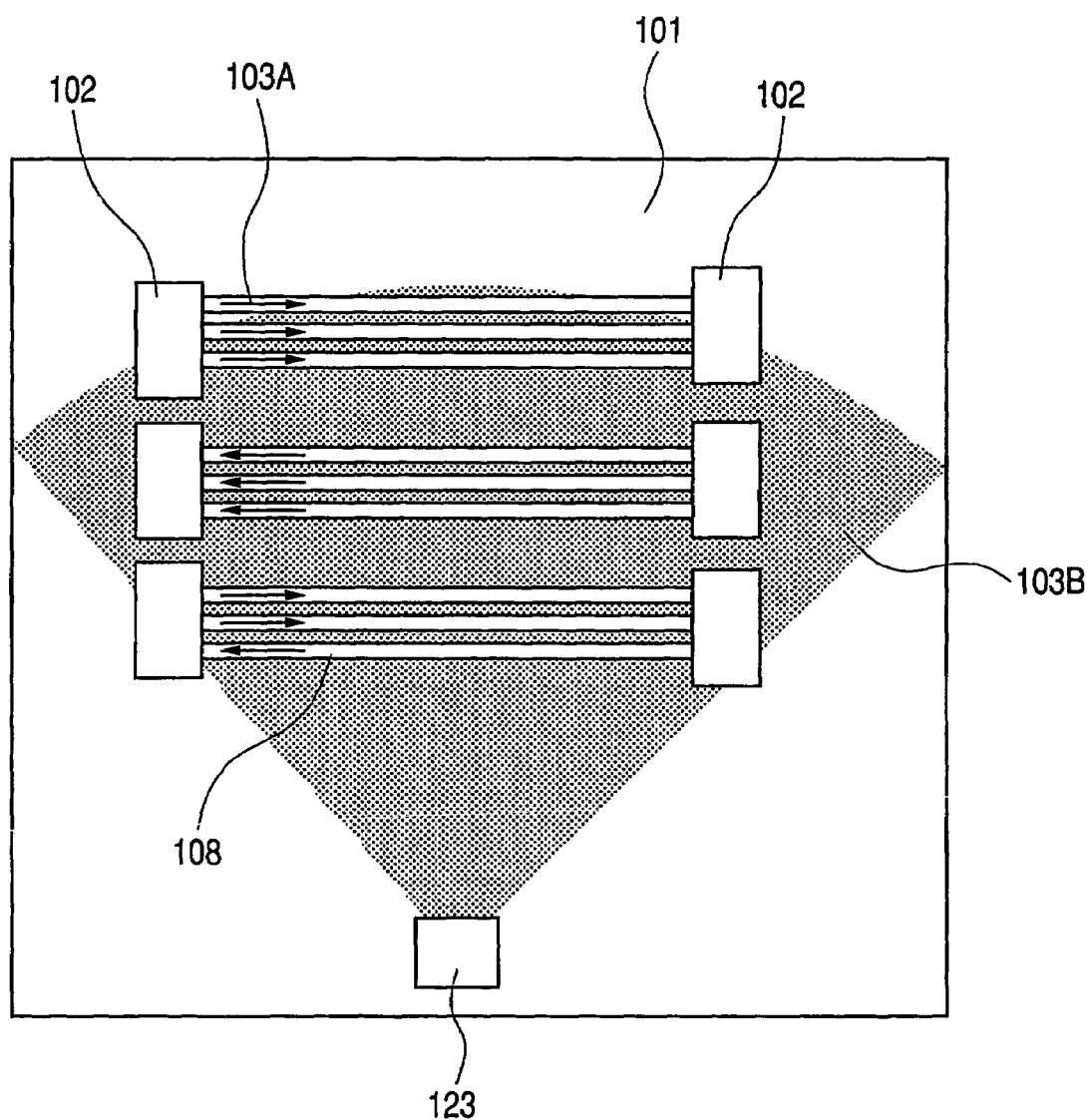
FIG. 5 is a schematic plan view of the optical transmission device used in Example 3.

In Example 3, an optical transmission device having a configuration similar to that of FIG. 5 is prepared. An optical transmission medium 101 having a configuration similar to that of its counterpart of Example 1 is also used in this example. In this example, the optical transmission medium 101 has a size of 3 cm square and is provided with optical ports 102 adapted to transmit and receive data signals by way of a plurality of line waveguides 108. A parallel transmission can be conducted between the ports that are linked together by way of a plurality of line waveguides 108. Apart from these ports, the optical transmission device additionally comprises a broadcast port 123 for broadcasting a clock signal. The optical signal 103B from the broadcast port 123 is propagated through the optical transmission medium that is a two-dimensional waveguide and received by the other ports 102.

Each of the ports 102 comprises an optical transmitter adapted to output light to the corresponding line waveguide 108, an optical receiver adapted to receive light from the corresponding line waveguide 108 and an optical receiver adapted to receive a clock signal propagated through the two-dimensional optical waveguide 101. The receivers for receiving the clock of the transmission/reception ports 102 that are connected by the line waveguides 108 are arranged at positions that are separated from the broadcast port 123 by the same distance. In this example, data are transmitted by way of the line waveguides 108 and a clock signal is transmitted from the broadcast port 123 to each of the ports 102. The clock signals that are received by the transmission/reception ports 102 do not show any difference of delay time because the transmission/reception ports 102 are arranged at positions that are separated from the broadcast port 123 by the same distance. Thus, bidirectional data transmission can be conducted efficiently by using the line waveguides 108 because clock signals are delivered without significant delays from the transmitters and the receivers.

EXAMPLE 4

In Example 4, an optoelectronic circuit board having a configuration similar to that of FIG. 6 is prepared. In other words, FIG. 6 is a schematic cross sectional view of the circuit board of this example, where an optical transmission medium 101 is sandwiched between a pair of electric wiring layers 105a, 105b and ports 102 (102a through 102c) are arranged near the interfaces of the electric wiring layer 105a and the optical transmission medium 101. The optical transmission medium 101 is similar to its counterpart of Example 1. Both the substrate 100 and the optical transmission medium 101 have a size of 3 cm square and a total of 25 ports 102 are arranged in the form of matrix of 5×5 as shown in FIG. 8.

As shown in FIG. 8, only the ports 102 at the four corners are connected by line waveguides 108. Only these ports 102 can utilize both optical connections using the line waveguides 108 and those using a two-dimensional waveguide 101, whereas the remaining ports 102 can utilize only optical connections using the two-dimensional waveguide 101.

Additionally, the optoelectronic circuit board of this example operates as a densely mounted multilayer circuit board as a printed circuit board, which electric circuit layer of electronic devices 107 (107a through 107c) and optical circuit layer is stacked in a manner as shown in FIG. 6. The signals from any of the electronic devices 107 that are LSIs (such as CMOS logic signals) can be transmitted by light by way of any of the ports 102 and the optical transmission medium 101 or the line waveguides 108. It is also possible to transmit a signal to one or more than one nearby electronic devices 107 by way of electric wires 106. The use of electric wires 106, the use of optical transmission using the line waveguides 108 or the use of free optical transmission using the two-dimensional waveguide 101 may be selected appropriately depending on the circumstances.

The logic signal from any of the LSIs 107 (3.3V in the case of CMOSs) provides voltage that is sufficiently high for driving the light emitting element of a port 102. As the logic signal is applied to the light emitting element of the port 102 as a forwardly biasing voltage, the electric signal being applied there is converted into an optical signal. Surface emission type lasers (VCSELs) of a 0.85 μm band are used for the light emitting elements. Each of the VCSELs is characterized by a drive current of 3.0 mA and an optical output level of 3 mW. Each of the ports 102 of this example comprises a VCSEL adapted to output a signal to any of the line waveguides 108 and a VCSEL adapted to output an optical signal into the two-dimensional optical waveguide that is to be diffused and propagated in all directions. Which mode of optical propagation is used depends on which VCSEL is driven.

The optical signal that is propagated through the optical transmission medium 101 is taken up by the light receiving element of a port 102 and converted into an electric signal. An Si-PIN photodiode is used for the light receiving element and connected to an electronic circuit 107. The electric signal produced by the conversion is taken into a nearby LSI as input electric signal and processed there. At this time, if the light receiving element and a preamp for amplifying received signals are integrally arranged, a CMOS compatible voltage can be restored. The light receiving section can be adapted to receive light from all directions, or 360°, of any of the two-dimensional optical waveguides 101 when a conical optical coupling section is used for it.

When the electronic devices and the optical devices of this example are driven, it was confirmed that an optical circuit is established between any two ports 102 and operates in a desired manner. In other words, it was confirmed that the optical circuit using both the line waveguides 108 and the two-dimensional optical waveguide 101 operates effectively and so do the electric circuits 107.

An attempt for establishing free connections between two-dimensionally arranged ports, using only line waveguides, requires communications by way of a plurality of ports or provision of a large number of optical switches for changing optical paths. To the contrary, this example, where a two-dimensional waveguide is used as an optical transmission medium, allows direct transmissions between ports that are separated from each other by a long distance. The circuit board of this example comprises a two-dimensional optical waveguide that allows to freely change connections in addition to electronic circuits and optical wiring using line waveguides. Hence, it is a circuit board with an enhanced degree of inter-connect freedom.

As described above, the present invention provides an optical transmission device that has a compact and simple configuration and is adapted to high speed data transmission and flexible inter-connect. The present invention also provides an optoelectronic circuit that can be highly densely mounted with elements and provides an enhanced degree of inter-connect freedom in addition to advantages of an optical circuit including high speed operation capabilities and immunity from EMIs.

The invention claimed is:

1. An optical transmission device, comprising:
an optical transmission medium including a sheet-shaped two-dimensional optical waveguide and a linear line waveguide buried in said sheet-shaped waveguide;
a first optical receiver adapted to receive a first optical signal transmitted from a first optical transmitter and propagated through said line waveguide; and
a second optical receiver adapted to receive a second optical signal transmitted from a second optical transmitter and propagated through said sheet-shaped waveguide in an intra-planar direction,
wherein the second optical signal propagated through said sheet-shaped waveguide intersects said line waveguide.

2. A device according to claim 1, wherein the ½-th power of the cross-sectional area of said line waveguide is not greater than ¼ of the thickness of said sheet-shaped waveguide.

3. A device according to claim 1, wherein said line waveguide is made to show a complex refractive index greater than that of said sheet-shaped waveguide.

4. A device according to claim 3, wherein the difference between the complex refractive index of said line waveguide and that of said sheet-shaped waveguide is not greater than 1%.

5. An optoelectronic circuit, comprising:
an optical transmission device; and
an electric wiring layer including electric wires and electronic devices, said optical transmission device comprising
an optical transmission medium including a sheet-shaped two-dimensional optical waveguide and a linear line waveguide buried in said sheet-shaped waveguide;
a first optical receiver adapted to receive a first optical signal transmitted from a first optical transmitter and propagated through said line waveguide; and
a second optical receiver adapted to receive a second optical signal transmitted from a second optical transmitter and propagated through said sheet-shaped waveguide in an intra-planar direction,
wherein the second optical signal propagated through said sheet-shaped waveguide intersects said line waveguide, and
wherein said optical transmission device and said electric wiring layer are laid one on the other, and said electronic devices being connected to said optical transmitters or said optical receivers by way of said electric wires.

* * * * *

UNITED STATES PATENT AND TRADEMARK OFFICE
CERTIFICATE OF CORRECTION

| | |
|---|---|
| PATENT NO. | : 7,349,592 B2 |
| APPLICATION NO. | : 10/546780 |
| DATED | : March 25, 2008 |
| INVENTOR(S) | : Tatsuya Iwasaki |

It is certified that error appears in the above-identified patent and that said Letters Patent is hereby corrected as shown below:

COLUMN 1:

Line 19, "to be" should read --to being--.

COLUMN 2:

Line 6, "speed/operation" should read --speed operation--.

COLUMN 3:

Line 25, "and used" should read --used--.

COLUMN 6:

Line 4, "¶ All the" should read --All the--; and
Line 13, "one of its side" should read --one of its sides--.

COLUMN 7:

Line 12, "¶ The reliability" should read --The reliability--; and
Line 27, "paths" should read --path--.

COLUMN 9:

Line 20, "receiver." should read --receivers.--;
Line 25, "arranged in array" should read --arranged in an array--; and
Line 47, "from the." should read --from the--.

UNITED STATES PATENT AND TRADEMARK OFFICE
CERTIFICATE OF CORRECTION

PATENT NO. : 7,349,592 B2  
APPLICATION NO. : 10/546780  
DATED : March 25, 2008  
INVENTOR(S) : Tatsuya Iwasaki It is certified that error appears in the above-identified patent and that said Letters Patent is hereby corrected as shown below:

COLUMN 11:

Line 11, "Fig. 1A" should read --Fig. 1A,--; and  
Line 23, "power;" should read --power:--.

COLUMN 12:

Line 43, "power;" should read --power:--.

COLUMN 14:

Line 18, "matrix" should read --a matrix--.

COLUMN 16:

Line 21, "comprising" should read --comprising:--.

Signed and Sealed this

Thirtieth Day of December, 2008

JON W. DUDAS  
*Director of the United States Patent and Trademark Office*